(12) United States Patent
Cheong et al.

(10) Patent No.: US 6,578,183 B2
(45) Date of Patent: Jun. 10, 2003

(54) METHOD FOR GENERATING A PARTITIONED IC LAYOUT

(75) Inventors: Kit-Lam Cheong, Palo Alto, CA (US); Wei-Jin Dai, Cupertino, CA (US); Hsi-Chuan Chen, Fremont, CA (US); Patrick John Eichenseer, Austin, TX (US)

(73) Assignee: Silicon Perspective Corporation, San Jose, CA (US)

( * ) Notice: Subject to any disclaimer, the term of this patent is extended or adjusted under 35 U.S.C. 154(b) by 36 days.

(21) Appl. No.: 10/003,932

(22) Filed: Oct. 22, 2001

(65) Prior Publication Data

US 2003/0079192 A1 Apr. 24, 2003

(51) Int. Cl.[7] .............................................. G06F 17/50
(52) U.S. Cl. ...................... 716/7; 716/6; 716/8; 716/11; 716/18
(58) Field of Search .............................. 716/6, 7, 8, 11, 716/18, 1, 2, 9, 10

(56) References Cited

U.S. PATENT DOCUMENTS

| | | | | |
|---|---|---|---|---|
| 5,544,066 A | * | 8/1996 | Rostoker et al. | 716/18 |
| 5,778,216 A | * | 7/1998 | Venkatesh | 713/503 |
| 6,249,902 B1 | | 6/2001 | Igusa et al. | 716/10 |
| 6,317,863 B1 | * | 11/2001 | Segal | 716/10 |

OTHER PUBLICATIONS

Venkatesh, S.V., "Hierarchical Timing–driven Floorplanning and Place adn Route Using a Timing Budgeter," IEEE 1995 Custom ICs Conference, pp. 469–472.*

* cited by examiner

Primary Examiner—Leigh M. Garbowski
(74) Attorney, Agent, or Firm—Daniel J. Bedell; Smith-Hill and Bedell

(57) ABSTRACT

When generating a layout for an integrated; circuit (IC) based on a netlist design, a trial layout which need only satisfy the various spatial, power and other constraints, but need not satisfy the layout's timing constraints, is quickly produced. The trial layout acts as a basis for estimating sizes and positions of substrate areas needed to accommodate various modules of the IC and for estimating delays through various signal paths having timing constraints. After producing the trial layout, the IC design is divided into several partitions with modules being grouped into partitions in accordance with their proximity to one another in the trial layout. A floor plan is created which imposes spatial constraints on each partition based on the estimated size and position within the trial layout of the modules forming the partition. A timing budget is also created which allocates portions of each timing constraint to the partitions based on the time delay estimates derived from the trial layout. The partitions are then separately placed and routed a manner consistent with the spatial and timing constraints imposed on each partition by the floor plan and the timing budget.

21 Claims, 3 Drawing Sheets

METHOD FOR GENERATING A PARTITIONED IC LAYOUT

BACKGROUND OF THE INVENTION

1. Field of the Invention

The present invention relates in general to a method for automatically generating a partitioned integrated circuit layout, and in particular to a method which automatically establishes separate timing criteria for each circuit partition.

2. Description of Related Art

The IC Design Process

An integrated circuit (IC) designer typically produces a high level "register transfer language" (RTL) netlist describing an IC only in terms of the logic it carries out. For example when a signal appearing at a node C of the circuit is to be the logical AND of signals appearing at circuit nodes A and B, an RTL netlist may describe the portion of the circuit to carry out that operation gate by using only the simple logic equation $C=A*B$. To test the logic of the circuit described by the netlist, the designer supplies the netlist and a "testbench" file as inputs to a circuit simulator. The circuit simulator then simulates the behavior of the circuit described by the netlist in response to a set of input signals described by the testbench file and produces output data describing the behavior of signals at various nodes of the circuit. However since the netlist models the AND gate as simple boolean operator, the simulator cannot take into account the actual switching speed of the AND gate when modeling circuit behavior.

Having used the simulator to verify the logic of the circuit, the designer uses "synthesis" CAD tools to create a "gate-level" netlist modeling the time-dependent behavior of the logic gates and other components (cells) needed to implement the logic defined by the RTL netlist. Boolean logic models of the RTL netlist are replaced in the gate level netlist with mathematical models provided by the cell library that reflect the time-dependent behavior of the cells. For example, instead of an RTL model of an AND gate as a simple boolean function $C=A*B$, the gate level netlist will model the AND gate with a mathematical expression having time as a variable and which describes the gate's input and output signals as analog voltages that ramp up or down over time in response to changes in input signal voltages. This more detailed netlist model of the circuit enables the circuit simulator to more accurately verify not only the circuit's logic but also the time-dependent behavior of the circuit. The designer can then use the simulator to test not only the circuit's logic, but also whether the circuit meets various timing constraints that the designer has imposed on the design. Each timing constraint typically places a maximum limit on the amount of time a signal needs to pass through a series of gates forming a particular signal path within the IC.

After using the simulator to verify the time-dependent behavior of the circuit described by the netlist, the circuit designer typically uses an automated placement and routing tool to convert the gate level netlist into an IC layout. The layout indicates how and where each cell is to be formed within the IC substrate and describes the signal routing structures within the IC that are to interconnect the cells. A typical placement and routing tool uses an algorithm which iteratively moves cells about on the substrate looking for a placement solution wherein all cells fit within the substrate area allocated for the placement, wherein the cells are properly interconnected, and wherein all timing and other constraints that the designer has imposed on the layout. Other constraints may include, for example, constraints on IC die size, power consumption, clock skew, and signal integrity.

While the gate level netlist upon which the layout is based accurately describes the time-dependent behavior of the cells, it does not accurately account for the time-dependent behavior of routing structures that interconnect the cells since the lengths and impedance characteristics of those structures are not known until the placement and routing tool lays out those structures. However the placement and routing tool attempts to position cells and design interconnect structure so as to satisfy various timing constraints for the signal paths they form.

Once the placement and routing tool has created an IC layout, the designer may use a netlist compiler to convert the layout back into another netlist that is similar to the gate level netlist, but which also accurately models the time-dependent behavior of the routing structures that interconnect the cells. The designer may then again use circuit simulation and timing verification tools to check the whether the circuit as laid out will satisfy its timing constraints as expected before sending the completed IC layout to an IC manufacturer.

As ICs become larger and more complex, it takes more time and processing power to convert a netlist into a layout. It can be quicker to separately lay out several small partitions of an IC than to layout the entire IC all at once, but a designer can find it difficult to determine how to best partition a circuit design and to accurately estimate the size, shape and position of the substrate area each partition will need. A designer can find it even harder to determine how to partition circuit timing constraints. When portions of a signal path for which there is a timing constraint are implemented within two or more partitions, the designer has to determine how much of the signal path's timing constraint should be allocated to each partition. The time required for a signal to travel through a set of logic gates forming a signal path depends not only on the switching delay of each gate, but also on the delays of the routing structures interconnecting those gates. Thus to allocate a timing constraint to portions of a signal path residing within two or more partitions, the designer needs to determine which gates are to be included within each partition and the delay of each gate. The designer would like to know the delays associated with the routing structures within and between each partition that interconnect those gates. However since the routing structures are designed during the layout process, it is difficult for the designer to estimate what those delays might be before the layout process begins.

What is needed is a method for automatically partitioning a circuit design and for allocating timing constraints between partitions in a manner that improves the chances that a full-chip layout incorporating all of the partition layouts will satisfy all of the circuit's timing constraints.

BRIEF SUMMARY OF THE INVENTION

The invention relates to a method for generating an integrated circuit (IC) layout for an IC design modeling an IC as a logical hierarchy of modules and including a set of timing constraints specifying maximum signal path delays for various signal paths within the IC.

A computer system implementing an IC layout method in accordance with the invention, initially generates a full-chip trial layout indicating the position of each cell in the substrate and describing routing structures interconnecting the cells. The trial layout need only satisfy various constraints that are usually relatively easy to satisfy, such as die size, power consumption, clock skew, and signal integrity. However since the trial layout need not necessarily satisfy all of the circuit's timing constraints, which are often relatively hard to satisfy, the system can generate the full-chip trial layout very quickly.

After generating the trial layout, the system automatically divides the IC design into a set of partitions. Since cells of a module tend to be highly interconnected with one another, and since it is preferable to minimize the number of signal paths linking partitions, the system divides the design along modular lines at the highest levels of the modular hierarchy for which the method can produce partitions that are roughly equal in size. Also since modules appearing near one another in the trial layout tend to be highly interconnected with one another, the system also tries to group modules appearing near one another in the trial placement together in the same partition.

After developing a partition plan, the system develops a floorplan allocating an appropriate amount of substrate area to each module. Since the trial layout tends to cluster cells of the same module of the circuit design near one another, the system is able to estimate the size shape of substrate areas needed to implement each module based on the size and shape of the substrate area spanned by cells forming each module within the trial layout.

The system also produces a timing budget for each signal path for which the circuit design includes a timing constraint. When sections of a signal path appear in more than one partition, the timing budget allocates a separate portion of the signal path's timing constraint to each path section. The amount of the maximum allowable signal path delay allocated to each section is proportional to the estimated path delay of the section, based on the delays of gates and of routing structures forming the path section in the trial layout.

The system then generates a separate layout for each partition, and in doing so, attempts to position and interconnect cells forming each signal path so as to satisfy the partition's timing budget. The individual partition layouts are combined to form a full-chip layout If the full-chip layout satisfies all of the circuit's timing and other constraints, then it is provided as the system's output layout for the IC. However if the full-ship layout does not'satisfy all constraints, then the process of partitioning the design, creating a timing budget, and separately laying out each partition is repeated. However prior to this second iteration of the process, the system recompiles the last generated full-chip layout back into a netlist description of the circuit, which now includes more detailed descriptions of the signal interconnect paths. It then produces a new trial layout based on the improved netlist uses the new trial layout, as a basis for determining how to partition the design and for developing a timing budget. The new trial layout is likely to be a more accurate predictor of module area requirements and path delays than the initial trial layout. The system iteratively repeats partitioning, time budgeting and layout process until it converges an modular layout satisfying the circuit's constraints.

It is accordingly an object of the invention to provide a method for use by a computerized placement and routing system, for automatically dividing a circuit design into partitions and for allocating timing constraints between partitions so that the placement and routing system can separately place and route each partition.

The claims portion of this specification particularly points out and distinctly claims the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWING(S)

DETAILED DESCRIPTION OF THE INVENTION

Figure 1:
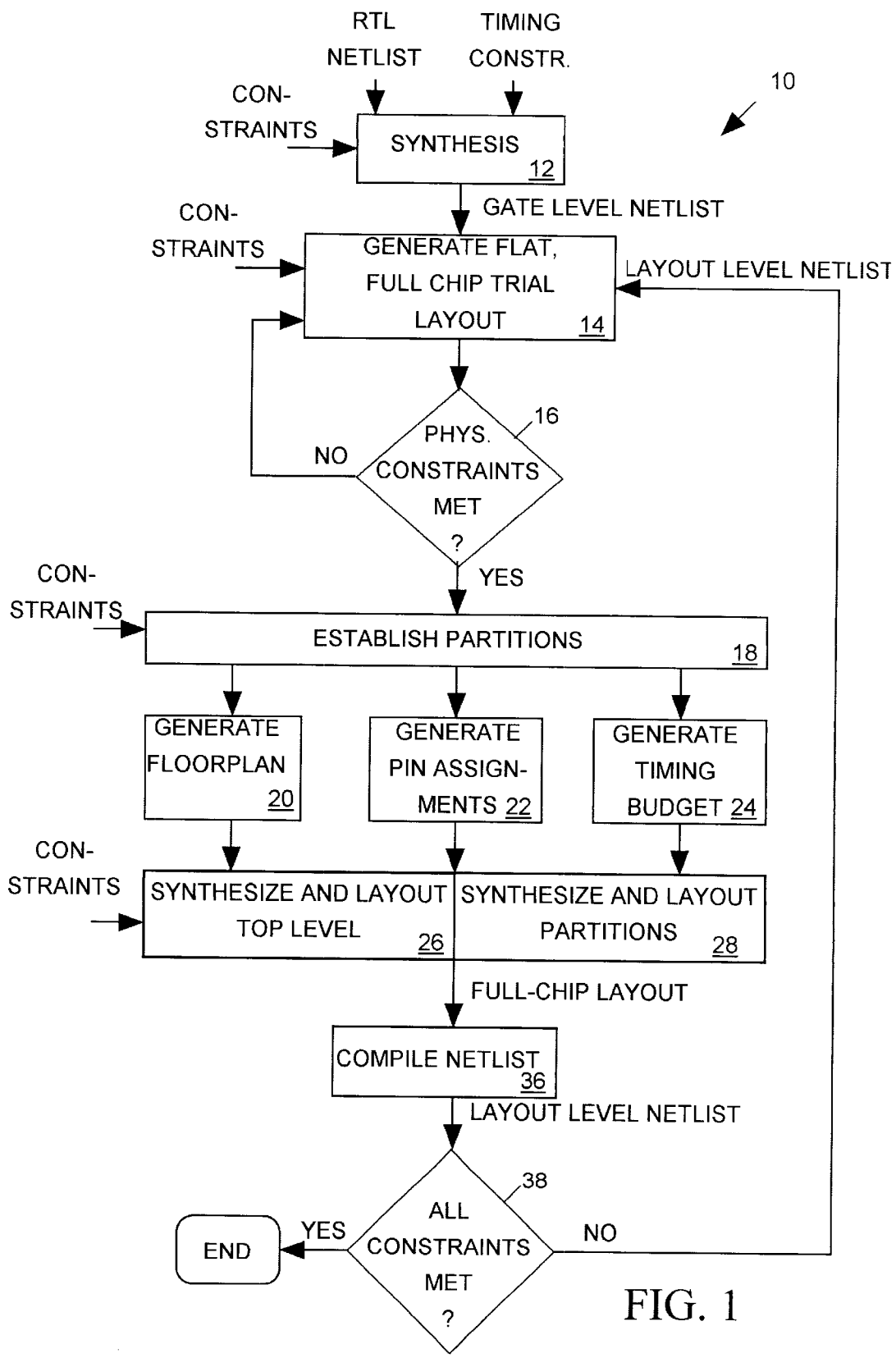
FIG. 1 is a flow chart illustrating a method in accordance with the invention for automatically generating a layout for an integrated circuit (IC) described by a hierarchical circuit design.

FIG. 1 is a data flow diagram illustrating a method 10 in accordance with the invention that may be implemented by a computer-based system for automatically generating a layout on a semiconductor substrate of an integrated circuit (IC) capable of carrying out logic described by a resistor transfer language (RTL) netlist in a manner that satisfies timing, die size and other constraints. The IC layout describes how various circuit components (cells) needed to implement the IC's logic are to be positioned within the substrate and describes the signal routing structures that are to interconnect those cells. In addition to implementing the logic described by the RTL netlist, the IC layout also satisfies various design constraints the designer imposes on the layout, including for example constraints on die size, power consumption, clock signal skew and signal path timing.

Trial Layout

Referring to FIG. 1, at step 12, a conventional synthesis tool initially converts the RTL netlist describing circuit logic into a gate level netlist referencing the library cells needed to implement the IC's logic and indicating how the cells are to be logically interconnected. A conventional placement and routing tool then generates a flat, full-chip trial layout for the IC (step 14). (A suitable placement and routing tool is described in U.S. Pat. No. 6,249,902, issued Jun. 19, 2001 to Igusa et al, incorporated herein by reference.) The gate level netlist describes the IC as being a hierarchy of circuit modules wherein modules at each level of the hierarchy are formed by modules and/or individual cells residing at a lower level of the hierarchy. The placement and routing tool is biased toward placing highly interconnected cells of the same module near one another in the semiconductor substrate. The placement and routing tool produces a trial layout at step 14 that satisfies various "physical" constraints on the IC including die size, clock skew and power consumption constraints. The placement and routing tool iteratively generates various layout alternatives and tests each alternative to determine whether it satisfies those constraints. Since is it usually relatively easy to find a layout satisfying the circuit's physical constraints, the placement and routing tool can normally generate the trial layout very quickly.

In addition to specifying physical constraints, the designer will also specify a set of timing constraints setting a maximum amount of time signals require to traverse various signal paths through the IC. Since a signal path having a timing constraint may include several gates, along with the routing structures that interconnect them, the signal path delay is the sum of the switching delays of the gates forming the path and the signal propagation delays of the signal routing structures that interconnect those cells. Since it is often very difficult to find a layout satisfying all timing constraints, it would take the placement and routing tool a long time to produce a trial layout meeting not only the IC's physical constraints but its timing constraints as well. However the placement and routing tool carrying out step 14 need run only long enough to find a layout satisfying the IC's physical constraints; the trial layout need not satisfy all of the circuit's timing constraints.

Partitioning

After a trial layout meeting the various physical constraints is found (step 16), the design is divided along modular lines (step 18) into several partitions so that each partition can be independently placed and routed. Partitions are sized to include approximately the same number of cells so that each partitions all require about the same amount effort to place and route. Since cells forming the same module tend to be more highly interconnected with one another then cells forming different modules, the method partitions the design at step 18 along modular lines at the highest levels of the hierarchy for which the method can produce partitions that are of generally similar size. This helps to minimize the number of signal paths that must pass between partitions. Though not necessary, the designer may place some constraints on how modules, can be grouped into partitions, for example by specifying that a particular module is to be the only module in one of the partitions.

Floor Planning

Based on an analysis of the trial placement, a floorplan plan is developed (step 20) allocating a particular area of the substrate to each partition. Since the placement and routing tool that produces the trial layout at step 14 is biased toward placing highly interconnected cells of the same module near one another in the semiconductor substrate, cells forming each module tend to cluster together in the trial layout. The somewhat irregularly shaped boundaries of an area within the trial placement containing all of the cells of a given module suggests the relative size, shape and position of a more regularly shaped "guide-block" area that might be able to contain the module if cells of that module were restricted to such a guide block area.

Figure 2:
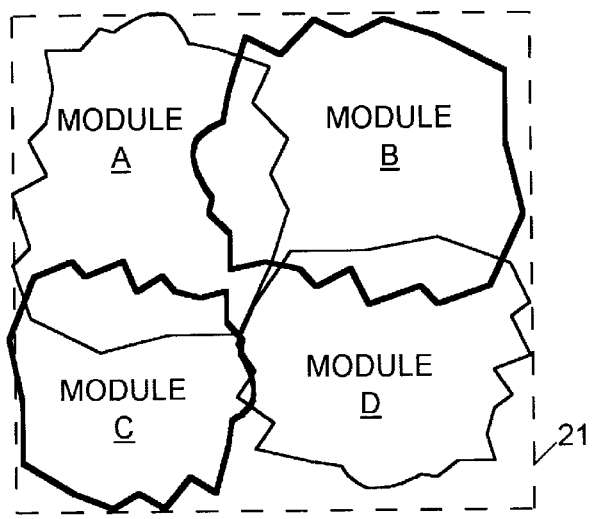
FIG. 2 is a block diagram illustrating a simple example of how a trial placement produced by the flat, full-chip placement and routing tool of the method of FIG. 1 might cluster cells of a circuit modules described by the hierarchical circuit design.

FIG. 2 illustrates a simple example of how the trial placement might cluster cells of a circuit having four top-level modules A–D in a substrate area 21. Although the actual boundaries of the areas containing various modules A–D will be somewhat irregular and will overlap one another to some extent as shown in FIG. 2, the module boundaries provide a basis for predicting an appropriate size, shape and relative position of a rectilinear, non-overlapping areas of the substrate that each module could occupy if separately placed.

Figure 3:
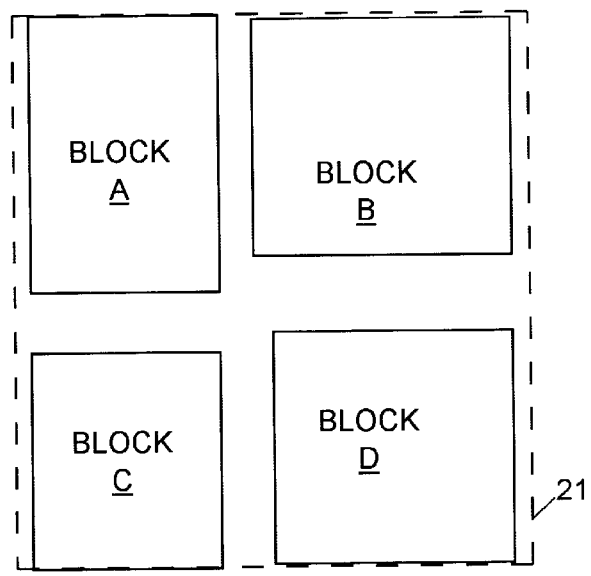
FIG. 3 represents a floorplan produced by the floor planner of FIG. 1.

FIG. 3 illustrates a set of rectilinear "guide block" areas A–D of substrate 21 that approximate a shape of an area spanning cells of a corresponding module A–D of the trial layout of FIG. 2. For simplicity the guide blocks A–D are shown as being rectangular, however guide blocks A–D may be rectilinear blocks having more than four sides that more closely approximate the more irregular shapes of the boundaries modules of A–D of FIG. 2. All guide block areas A–D of substrate 21 modules are made small enough that they do not overlap and so that they are separated by a minimum distance to provide space for inter-module routing paths.

Figure 4:
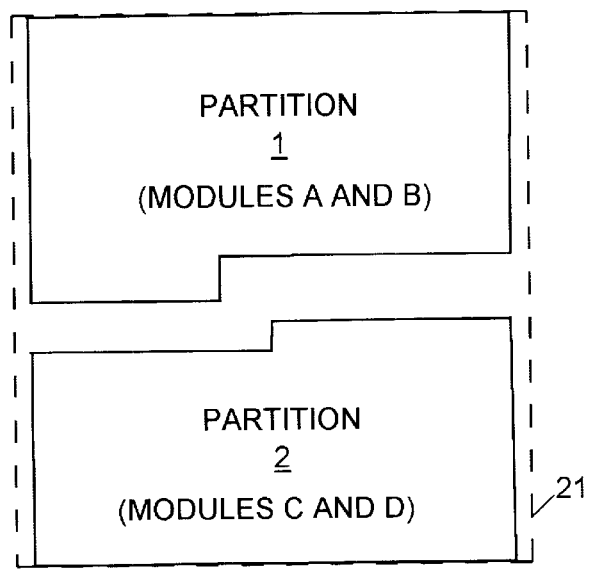
FIG. 4 is a depiction of a manner in which the partition engine of the method of FIG. 1 would allocate substrate space to two partitions based on the floorplan of FIG. 3.

FIG. 4 illustrates a top level floorplan created at step 20 (FIG. 1) based on the shape, size and position of the guide blocks A–D. In the example shown in FIG. 4, there are to be two partitions formed from the four modules. Partition 1 includes modules A and B and spans the areas reserved for guide blocks A and B of FIG. 3. Partition 2 include modules C and D and spans guide block C and D of FIG. 3.

If the design cannot be partitioned at the level of the modular hierarchy on which modules A–D reside so that partitions 1 and 2 are sufficiently close in size, the module containing the most cells (for example module B) can be resolved into its submodules at a next lower level of the design hierarchy. This allows some of the submodules of module B to be allocated to partition 1 and others of its submodules to be allocated to partition 2. In such case, guide blocks are established for each submodules of module B to aid in the sizing of partitions 1 and 2. If partitions 1 and 2 still are not sufficiently similar in size, the next largest module (for example module A) can be subdivided among partitions. Preferably only the largest, highest level, modules of the design are divided among partitions as necessary to provide a partitioning plan in which the smallest partition has, for example, 80% of the cells of the largest partition. This helps to ensure that the layout process for each partition will require about the same amount of computing resources and time.

Pin Assignments

In addition to creating a top level floorplan after partitioning the design, the method also creates a partition pin assignment plan at step 22 fixing positions along each partition boundary at which signal paths passing between portions are to cross. Since the trial layout produced at step 14 includes all routing paths, the trial layout provides a guide for making partition pin assignments. The pin assignment plan for each partition acts as a constraint on the subsequent layout for that partition.

Timing Budget

In addition to dividing the IC design into several partitions, and creating a floorplan allocating substrate space to each partition (step 20) and creating a pin assignment plan for each partition (step 22), a timing budget is created (step 24) which allocates portions of timing constraints for single paths extending through more than one partition to each such partition (step 24).

Figure 5:
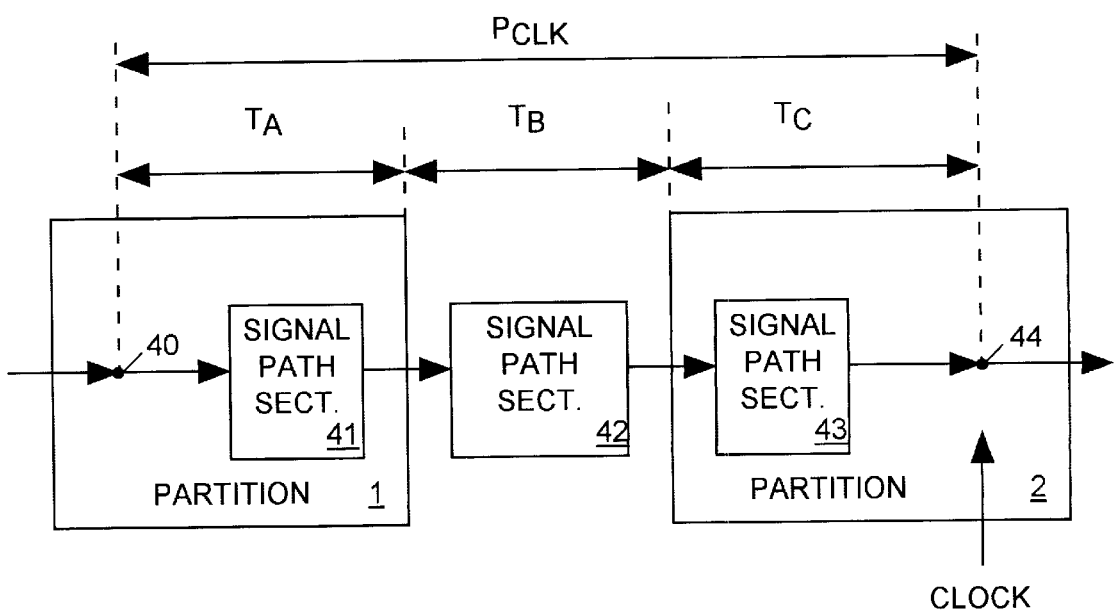
FIG. 5 depicts in block diagram form a signal path between two nodes that is subject to a timing constraint.

Referring to FIG. 5, suppose the designer has imposed a T nanosecond (ns) timing constraint on a signal path extending between a pair of nodes 40 and 44 located within separate partitions 1 and 2. To partition the timing constraint, the system analyzes the trial placement to determine the signal path delays through the section 41 of the signal path within a partition 1, through the section 43 of the signal path within a partition 2, and through the section 42 of the path extending between partitions 1 and 2.

The method analyzes the trial layout to predict the signal path delays $T_A$, $T_B$, and $T_C$ within path section 41–43 based on the known switching speed of cells included in the signal path and on estimates of signal path deals through the routing structures depicted in the trial layout using well known methods for calculating such signal path delays. The method then calculates a separate timing constraint $T_{BA}$, $T_{BB}$, and $T_{BC}$ for each of portion 41–43, respectively, of the signal path as follows:

$$T_{BA}=(T_{BA}/(T_{BA}+T_{BB}+T_{BC}))T$$

$$T_{BB}=(T_{BB}/(T_{BA}+T_{BB}+T_{BC}))T$$

$$T_{BC}=(T_{BC}/(T_{BA}+T_{BB}+T_{BC}))T$$

These calculated constraints are incorporated into the timing budget produced at step 24. Since the signal paths within the trial layout produced at step 14 need not satisfy all timing constraints, the sum of signal delays $T_A+T_B+T_C$ for the signal path at is appears in the trial placement may exceed the T. However the above formulas apportion timing constraint T among the path sections 41–43 so that the sum of their budgeted delay times $T_{BA}+T_{BB}+T_{BC}$ does not exceed T. Thus if partitions 1 and 2 and the "top level" area connecting those partitions are subsequently laid out in a manner in which path delays through path sections 41–43 are no greater than the delays permitted by their timing budgets $T_{BA}$, $T_{BB}$, and $T_{BC}$, then the signal path delay between nodes 40 and 44 will be brought within the total path timing constraint T.

Partition and Top-Level Synthesis and Layout

After producing a top level floorplan (step 20), determining partition pin assignments (step 22), and producing a timing budget (step 24), the method separately carries out conventional synthesis and layout at the top level of the design (step 26) and for each partition (step 26). During the top level layout process, each partition is treated like a single "black box" cell having the dimensions indicated by the top level floorplan produced at step 20 and having the pin assignments at positions along the partition boundaries indicated by the pin assignment plan produced at step 22. The system tries to produce a top level layout in which single paths between partitions that satisfy constraints included in the time budget produced at step 24. Each partition is independently laid out at step 28 in a manner that attempts to satisfy spatial constraints imposed on the partition by the floor and pin assignment plans generated at steps 20 and 22, and that attempts to satisfy the timing constraints for that partition specified in the timing budget generated at step 24.

The top level and partition layouts produced at steps 26 and 28 in combination form an output full-chip IC layout which is then recompiled into a "layout level" netlist at step 36. The layout level netlist produced at step 36 differs from the gate level netlist produced at step 12 because in addition to modeling the cells forming the circuit logic, the low level netlist also includes an accurate model of the signal path delays through routing structures developed at steps 26 and 28. The gate level netlist produced at syntheses step 12 does not accurately model signal path delays between gates very accurately because the gate level netlist is not based on an actual layout.

Conventional synthesis and verification tools then analyze the layout level netlist produced at step 36 to determine whether the circuit defined by the full-chip layout will satisfy all timing and other constraints (step 38). If the layout is found to be satisfactory at step 36, the last generated full-chip layout is accepted as the final layout for the IC.

However if the placement and routing tools that generated the top level and partition layouts at steps 26 and 28 were not able to meet all constraints imposed by the top level floorplan, pin assignment plan and timing budget produced at steps 20, 22 and 24, then the method returns to step 14 and the process is repeated. During the second iteration of the layout process, the method bases the flat, full-chip trial layout produced at step 14 on the layout level netlist generated at step 36, rather than on the gate level netlist generated at step 12. The layout level netlist includes more accurate information about the sizes of areas needed to accommodate modules and about the signal path delays between cells. Therefore the floorplan, pin assignments and timing budget produced at steps 20, 22 and 24 are more likely to allow the system to generate top level and partition layouts at steps 26 and 28 satisfying all circuit constraints. The system can iteratively repeats partitioning, time budgeting and layout process (steps 14–38) until it converges a full-chip layout satisfying the circuit's constraints at step 38.

Thus as described herein above, the integrated circuit layout method 10 in accordance with the invention divides a hierarchical integrated circuit design into several partitions that can be separately placed and routed. A trial layout provided by a conventional full-chip P&R tool at step 14, acts as a guide for estimating appropriate sizes, shapes and relative positions of various modules and for estimating path delays through various IC signal paths. Use of the trial layout for developing such estimates greatly reduces enables the method in accordance with the invention to produce an IC layout much quicker than conventional layout methods. The method also produces layouts in which various modules are placed in identifiable areas of a semiconductor substrate. Using the partition method to layout an IC can also make it easier for a designer to subsequently make small changes to the design of a module without having to modify the layout of the entire IC, since only the layout of the partition containing the module are affected.

While the forgoing specification has described what the applicant(s) consider to be the best mode(s) of practicing the invention, the appended claims are intended to cover all modes employing the combination of elements or steps recited in any one of the claims, including modes employing elements or steps that are functional equivalents of the elements or steps as described herein above.

What is claimed is:

1. A method for converting a first netlist modeling an integrated circuit (IC) as a network of interconnected cells into an output layout indicating the cells' positions within the semiconductor substrate, and describing structures for routing signals between the cells, wherein the first netlist organizes the cells into a logical hierarchy of modules, and wherein the layout is to satisfy a plurality of timing constraints, each indicating a maximum path delay for a separate signal path within the IC, the method comprising the steps of:

a. generating a trial layout placing and interconnecting all the cells of the IC in accordance with the first netlist model of the IC in a manner that is biased toward grouping cells of the same module near one another in the semiconductor substrate;

b. producing a floorplan allocating a separate portion of semiconductor substrate area to each of a plurality of partitions, each partition including a separate set of the modules, wherein the floorplan allocates a portion of substrate area to each partition with regard to an amount of substrate area modules forming that partition span in the trial layout;

c. generating a timing budget allocating a portion of each signal path's maximum allowable signal path delay to each signal path section to be included in a separate one of said partitions in proportion to an estimated path delay through that signal path section as described in the trial layout;

d. generating for each partition included in the floorplan a separate partition layout positioning and interconnecting cells included in the partition in a manner that is biased toward placing each partition within the area of the semiconductor substrate the floorplan allocates to that partition, and in a manner that is biased toward limiting the signal path delay through each of said signal path sections to the portion of the maximum signal path delay the timing budget allocates to that signal path section; and e. generating a full-chip layout for the entire IC incorporating each partition layout generated at step d.

2. The method in accordance with claim 1 further comprising the step of:

f. processing the full-chip layout to generate a second netlist describing the IC, and repeating steps a–e with the second netlist being substituted for the first netlist.

3. The method in accordance with claim 2 further comprising the step of:

g. repeating step f until the full-chip layout produced at step e satisfies all of said timing constraints.

4. The method in accordance with claim 1 wherein the IC layout is subject to additional constraints other than said timing constraints wherein step a comprises the substeps of:

a1. generating a trial layout placing and interconnecting all the cells of the IC in accordance with the first netlist model of the IC; and a2. analyzing the trial layout generated at step a1 to determine whether it satisfies the additional constraints, and providing that trial; and a3. repeating steps a1 and a2 with a different trial layout being produced during each interaction of step a1 until a trial layout is generated that satisfies said additional physical constraints.

5. The method in accordance with claim 4 wherein said additional constraints include constraints on an area of the semiconductor substrate the layout may occupy and an amount of power the IC may consume.

6. The method in accordance with claim 1 wherein the trial layout is generated at step a without regard to satisfying all of said timing constraints.

7. The method in accordance with claim 1 wherein step b comprises the substeps of:

b1. processing the trial layout to determine area of areas of the semiconductor substrate spanned by cells forming modules of the IC;

b2. allocating modules among the partitions in a manner that is biased toward making each partition have an approximately similar number of cells and toward grouping modules appearing near one another in the trial layout into the same partition; and b3. producing the floorplan allocating said portion of substrate area to each partition in substantial proportion to the substrate area modules forming that partition are determined to span at step b1.

8. The method in accordance with claim 7 wherein step b3 comprises:

b31. establishing for each of said modules an associated rectilinear guide block approximating a shape of the area of the semiconductor substrate determined at step b1 to be spanned by cells forming the module, each guide block being positioned in a separate area of the substrate; and b32. producing the floorplan allocating said portion of substrate area to each partition so as to include the guide block areas associated with the modules forming the partition.

9. The method in accordance with claim 1 wherein step c comprises the substeps of:

c1. for each signal path for which there is a timing constraint, determining an estimated signal total path delay through the entire signal path and an estimated signal path delay through each section of the path to be included in a separate one of said partitions based on a layout of the signal path appearing within in the trial layout, and c2. for each section of a signal path for which there is a timing constraint, calculating the portion of the maximum allowable path delay to be allocated to that section as a product of the estimated signal through that section and the total allowable signal path delay, divided by the estimated total signal path delay for that signal path.

10. The method in accordance with claim 1 further comprising the step of:

f. processing the full-chip layout to generate a second netlist describing the IC, and repeating steps a–e with the second netlist being substituted for the first netlist, and g. repeating step f until the full-chip layout produced at step e satisfies all of said timing constraints, wherein the trial layout is generated at step a without regard to satisfying all of said timing constraints but wherein the trial layout satisfies constraints on an area of the semiconductor substrate the layout may occupy and an amount of power the IC may consume.

11. The method in accordance with claim 10 wherein step b comprises the substeps of:

b1. processing the trial layout to determine area of areas of the semiconductor substrate spanned by cells forming modules of the IC;

b2. allocating modules among the partitions in a manner that is biased toward approximately equalizing a number of cells included in the partitions and toward grouping modules appearing near one another in the trial layout into the same partition; and b3. establishing for each of said modules an associated rectilinear guide block approximating a shape of the area of the semiconductor substrate determined at step b1 to be spanned by cells forming the module, each guide block being positioned in a separate area of the substrate; and b4. producing the floorplan allocating said portion of substrate area to each partition so as to include the guide block areas associated with the modules forming the partition.

12. The method in accordance with claim 11 wherein step c comprises the substeps of:

c1. for each signal path for which there is a timing constraint, determining an estimated signal total path delay through the entire signal path and an estimated signal path delay through each section of the path to be included in a separate one of said partitions based on a layout of the signal path appearing within in the trial layout, and c2. for each section of a signal path for which there is a timing constraint, calculating the portion of the maximum allowable path delay to be allocated to that section as a product of the estimated signal through that section and the total allowable signal path delay, divided by the estimated total signal path delay for that signal path.

13. A method for converting a netlist modeling an integrated circuit (IC) as a network of interconnected cells into an output layout including descriptions of the cells, descriptions of positions of the cells within a semiconductor substrate, and descriptions of structures that route signals between the cells, wherein the netlist organizes the cells into a logical hierarchy of modules, and wherein the IC layout is subject to a set of timing constraints specifying maximum allowable signal path delays for signal paths within the IC, the method comprising the steps of:

a. processing the netlist to generate a trial layout for the entire IC, including descriptions of the cells forming the IC, descriptions of their positions within the semiconductor substrate, and descriptions of structures for routing signals between the cells;

b. developing a floorplan allocating substrate area to each of a plurality of partitions with modules being distributed among the partitions based on sizes and relative positions of substrate areas which the trial layout indicates encompass cells of the modules; and c. generating a timing budget for each signal path having a timing constraint, wherein when a signal path includes sections in modules distributed to more than one partition, the timing budget allocates a separate portion of the timing constraint to each of the signal path sections.

14. The method in accordance with claim 13 further comprising the steps of:

d. generating a partition layout for each partition, wherein each partition layout includes descriptions of the cells included in the partition, of positions of those cells within the IC substrate, and of structures for routing signals between those cells, wherein each partition layout is designed to position and interconnect cells forming each signal path having a timing constraint in a manner that attempts to satisfy the timing budget for that signal path.

15. The method in accordance with claim 14 further comprising the step of:

e. generating the output layout, wherein the output layout includes the partition layouts generated at step d.

16. The method in accordance with claim 14 further comprising the steps of:

e. generating a full-chip layout for the entire IC incorporating each partition layout generated at step e;

f. repeating steps b–e using the full-chip layout last generated at step e as the trial layout at step b until the full-chip layout generated at step e complies with said set of timing constraints; and g. then providing the full-chip layout last generated at step e as said output layout.

17. The method in accordance with claim 16 wherein separate placement and routing tools are employed to concurrently generate partition layouts for all partitions at step d;

wherein the trial layout generated at step a fails to meet at least one of said timing constraints;

wherein the portion of the timing constraint the timing budget allocates to a section of any signal path included in any one of the partitions is sized at step c in accordance with an estimated signal path delay of that portion of the signal path, wherein the estimated signal path delay is determined based on the descriptions included in the trial layout; and wherein step b comprises the substeps of:

b1. based on the descriptions of cell positions included in the trial layout, determining boundaries of a plurality of first areas of the substrate, each first area corresponding to a separate one of the modules and containing all cells of that module;

b2. creating a floorplan for the substrate identifying a plurality of non-overlapping second areas, each second area corresponding to a separate one of the modules and being sized in proportion to a size of that module's corresponding first area; and b3. dividing the netlist into the plurality of partitions with modules being distributed among the partitions based on sizes-of their corresponding second areas.

18. The method in accordance with claim 16 wherein the portion of the timing constraint the timing budget allocates to a section of any signal path included in any one of the partitions is sized at step c in accordance with an estimated signal path delay of that portion of the signal path, and wherein the estimated signal path delay is determined based on the descriptions included in a most recently generated trial or full-chip layout.

19. The method in accordance with claim 14 wherein separate placement and routing tools are employed to concurrently generate partition layouts for all partitions at step d.

20. The method in accordance with claim 13 wherein the trial layout generated at step a fails to meet at least one of said timing constraints.

21. The method in accordance with claim 13 wherein step b comprises the substeps of:

b1. based on the descriptions of cell positions included in the trial layout, determining boundaries of a plurality of first areas of the substrate, each first area corresponding to a separate one of the modules and containing all cells of that module;

b2. creating a floorplan for the substrate identifying a plurality of non-overlapping second areas, each second area corresponding to a separate one of the modules and being sized in proportion to a size of that module's corresponding first area; and b3. dividing the netlist into the plurality of partitions with modules being distributed among the partitions based on sizes of their corresponding second areas.

* * * * *